United States Patent [19]

Iwamura et al.

[11] Patent Number: 5,315,600
[45] Date of Patent: May 24, 1994

[54] ERROR CORRECTION SYSTEM INCLUDING A PLURALITY OF PROCESSOR ELEMENTS WHICH ARE CAPABLE OF PERFORMING SEVERAL KINDS OF PROCESSING FOR ERROR CORRECTION IN PARALLEL

[75] Inventors: Keiichi Iwamura, Kawasaki; Takayuki Aizawa, Yokohama; Izumi Narita, Koganei; Takatoshi Suzuki, Tokyo, all of Japan

[73] Assignee: Canon Kabushiki Kaisha, Tokyo, Japan

[21] Appl. No.: 711,990

[22] Filed: Jun. 7, 1991

[30] Foreign Application Priority Data

Jun. 28, 1990 [JP] Japan ................................ 2-168331

[51] Int. Cl.⁵ .............................................. G06F 11/00
[52] U.S. Cl. .................................. 371/37.6; 371/38.1; 371/44
[58] Field of Search ................ 371/37.6, 37.1, 38.1, 371/39.1, 43, 44

[56] References Cited

U.S. PATENT DOCUMENTS

| | | | |
|---|---|---|---|
| 3,534,331 | 10/1970 | Kautz . | |
| 4,649,541 | 3/1987 | Lahmeyer | 371/37 |
| 4,747,103 | 5/1988 | Iwamura et al. | 371/37 |
| 4,751,704 | 6/1988 | Kojima | 371/37 |
| 4,882,731 | 11/1989 | Van Gils | 371/37.6 |
| 5,068,857 | 11/1991 | Yoshida | 371/37.6 |
| 5,099,483 | 3/1992 | Kadokawa | 371/37.6 |

FOREIGN PATENT DOCUMENTS 6221137 10/1983 Japan .

OTHER PUBLICATIONS

Clark, Jr., et al., "Error Correction Coding for Digital Communications" Plenum Press, New York, 1981, pp. 188 through 195.

Primary Examiner—Vincent P. Canney
Attorney, Agent, or Firm—Fitzpatrick, Cella, Harper & Scinto

[57] ABSTRACT

Respective processes of decoding in error correction are subjected to parallel processing using a plurality of processing elements (PEs) each having the same configuration. At any given time, when processing of one process has been terminated, processing proceeds to a PE having the highest priority among PEs waiting for processing. The PE which has received data recognizes and executes the next process for that data.

8 Claims, 8 Drawing Sheets

ERROR CORRECTION SYSTEM INCLUDING A PLURALITY OF PROCESSOR ELEMENTS WHICH ARE CAPABLE OF PERFORMING SEVERAL KINDS OF PROCESSING FOR ERROR CORRECTION IN PARALLEL

BACKGROUND OF THE INVENTION

1. Field of the Invention

This invention relates to an error correction system which detects and corrects errors in a storage medium, such as an optical disk, a magnetic disk or the like, or in a communication channel of satellite communications or the like, utilizing error correcting codes.

2. Description of the Prior Art

Recently, error correcting codes have been utilized more and more as means for increasing reliability in various kinds of digital systems, such as in a memory system using optical disks or the like. Among various kinds of error correcting codes which have the same code length and correcting capability, a Reed-Solomon code (hereinafter termed an "RS code") is the most important from the viewpoint of practical use, because it includes the feature of providing the smallest redundancy. Accordingly, the RS code has been widely utilized in satellite communications, optical disks, magnetic disks or the like.

An encoder/decoder or a decoder for performing processing of the RS code at a high speed may be relatively easily provided if the correcting capability of the RS code is as small as about 1 or 2.

However, if the correcting capability is increased, the size and control of the device becomes very complicated, and the calculation time needed for decoding processing is also increased.

In order to solve the above-described problems, an error correction method using systolic arrays, which is one of many parallel processing methods, has been proposed (e.g., the Transactions of the Institute of Electronics, Information and Communication Engineers, Vol. J71-A, No. 3, pp. 751-759, referred to as the IEICE Article, and which generally corresponds to copending U.S. patent application, Ser. No. 07/982,062).

According to this method, high-speed processing can be realized with a simple control and a simple circuit configuration for a code having a large correcting capability by performing all the processing necessary for encoding/decoding using the RS code with a configuration of systolic arrays having the same processing elements (hereinafter referred to as "PEs").

Figure 7:
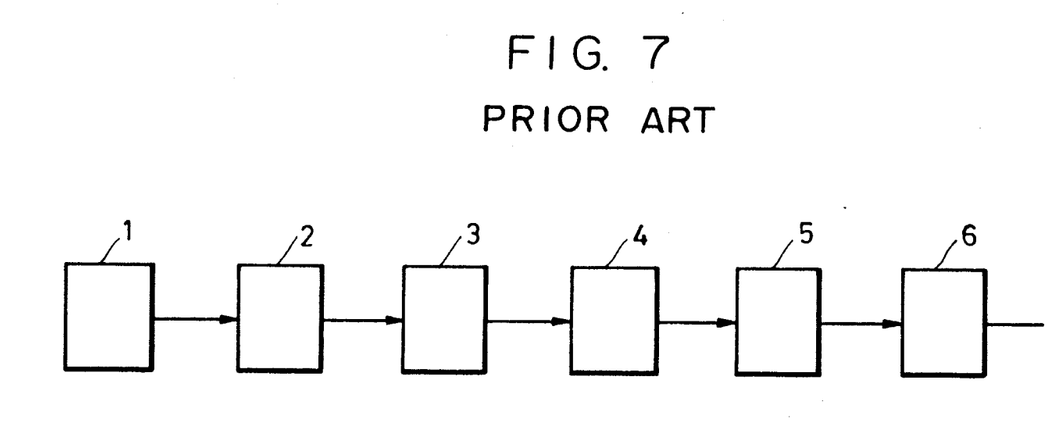
FIG. 7 is a block diagram of the configuration of a conventional decoder.

An example of the system configuration using the conventional systolic array configuration is shown in FIG. 7. An example of the circuit configuration of the PEs is shown in FIG. 8.

Figure 8:
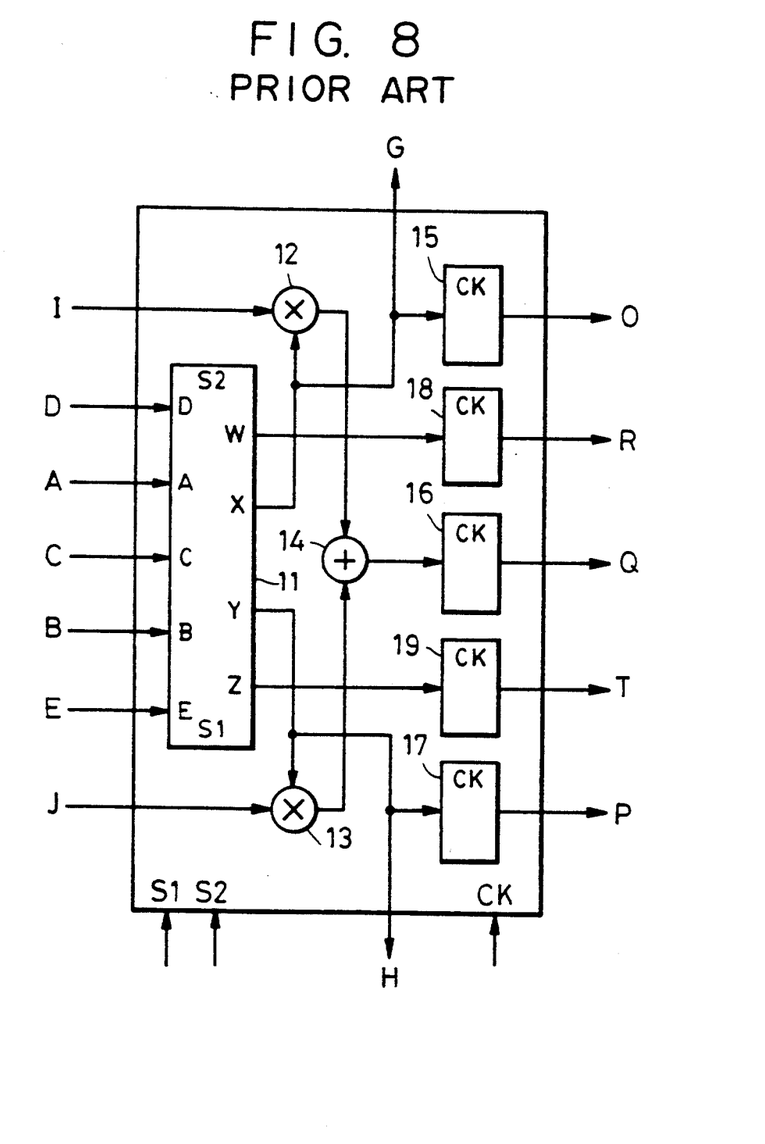
FIG. 8 shows an example of the configuration of a processing element (PE).

In this method, as shown in FIG. 7, a series of processing steps necessary for encoding/decoding using an RS code are performed in a sequential pipeline system using processing units 1-6 comprising the same PEs each having, for example, the configuration shown in FIG. 8.

In FIG. 8, there are shown a selector 11 controlled by signals S1 and S2, multipliers 12 and 13 on a Galois field, an adder 14 on a Galois field, and registers 15-19.

However, the conventional processing system, wherein all the processing necessary for encoding/decoding using the RS code is performed using the configuration of the systolic arrays having the same PEs, has a problem that respective processing units have different frequencies, that is, calculation loads, necessary for one processing step due to differences in the contents of the respective processing steps, such as the generation of a syndrome polynomial, the generation of an error locator polynomial or the like.

That is, when trying to perform all the processing steps necessary for encoding using the RS code by the systolic arrays, units which await processing are present within the system during the execution of the processing, because the calculation load differs for each processing unit. Hence, the overall system is not very efficient.

When correcting an erasure, a case may occur wherein the number "s" of erasures is "0" (no erasure is present) according to a codeword. In such a case, in the conventional method, $(d-2t-1)$ PEs are always allocated for the generation of an erasure locator polynomial, where d represents a minimum distance and t represents the correcting capability). Hence, a delay time is needed for such an allocation.

SUMMARY OF THE INVENTION

It is an object of the present invention to provide an efficient error correction system, by removing elements which await processing due to any unevenness in the calculation load, in a system which executes error correction by parallel processing using a plurality of processing elements.

It is another object of the present invention to provide an error correction system which does not need a control unit for the entire system, by arranging the system so that each element can control the execution of its own processing while determining the operating state for the entire system, in a system which executes error correction by parallel processing using a plurality of processing elements.

It is still another object of the present invention to provide an efficient error correction system which eliminates wasteful processing for erasure correction, when erasure correction is unnecessary, in a system which executes error correction by parallel processing using a plurality of processing elements.

According to one aspect, the present invention which achieves these objectives relates to an error correction system comprising a plurality of processing elements capable of parallel operation while being connected to one another, each of which comprises detection means for detecting a condition of a respective element and conditions of elements having a higher priority than the respective element, processing means capable of executing each step in a series of processing steps for error correction, recognition means for recognizing processing step to be performed for data serving as an object of processing among the series of processing steps, and control means for controlling the processing means to execute the processing recognized by the recognition means when the detection means detects that all the elements having higher priority are incapable of performing processing and the respective element is capable of performing the processing.

According to another aspect, the present invention which achieves these objectives relates to an error correction system comprising a plurality of processing elements capable of parallel operation while being connected to one another, each of which comprises detection means for detecting a condition of a respective element and conditions of elements having a higher priority than the respective element, processing means capable of executing each step in a series of processing steps for error correction, indication means for indicating whether or not erasure correction is necessary for data serving as an object of processing, recognition means for recognizing a processing step to be performed for the data serving as the object of processing among the series of processing steps by skipping processing for erasure correction among the series of processing steps when the indication means indicates that erasure correction is unnecessary, and control means for controlling the processing means to execute the processing recognized by the recognition means when the detection means detects that all the elements having a higher priority are incapable of performing processing and the respective element is capable of performing processing.

According to still another aspect, the present invention which achieves these objectives relates to an error correction system comprising a plurality of processing elements capable of parallel operation while being connected to one another, each of which comprises detection means for detecting a condition of a respective element and conditions of elements having a higher priority than the respective element, processing means, capable of executing encoding of data and each step in a series of processing steps of decoding of the data, comprising recognition means for recognizing processing to be performed for data serving as an object of processing among the series of processing steps, and control means for controlling the processing means to execute the processing recognized by the recognition means when the detection means detects that all the elements having a higher priority are incapable of performing processing and the respective element is capable of performing processing.

Other objectives and advantages besides those discussed above will be apparent to those skilled in the art from the description of preferred embodiments of the invention which follows. In the description, reference is made to the accompanying drawings, which form a part thereof, and which illustrate examples of the invention. Such examples, however, are not exhaustive of the various embodiments of the invention, and therefore reference is made to the claims which follow the description for determining the scope of the invention.

DETAILED DESCRIPTION OF THE PREFERRED EMBODIMENTS

An explanation will now be provided of preferred embodiments of the present invention with reference to the drawings.

RS encoding/decoding is usually performed according to the following procedure.

An RS code having a code length $n \leq 2^m - 1$, an error correcting capability t and a minimum distance d is used, and a generator polynomial $$G(x) = \prod_{i=1}^{d-1} (x - \alpha^i)$$

is used, where m is a positive integer and $\alpha$ is a primitive element. A code is defined on GF $(2^m)$.

Encoding is performed according to the following procedure.

A polynomial $P(x) = I(x) \cdot x^{d-1} \bmod G(x)$ is generated from a polynomial $$I(x) = \sum_{i=1}^{k} I_{k-1} \cdot x^{k-i}$$

having coefficients of information series $(I_{k-1}, I_{k-2}, \ldots, I_0)$ and a generator polynomial G(x). Coefficients of P(x) provide check symbols, and deg $P(x) < n - k$.

Various methods of decoding RS codes encoded as described above are present. In the present embodiments, the following method is adopted.

An explanation will be provided for a case wherein s erasures are present in positions j1, j2, . . . , js, and r errors are present in positions k1, k2, . . . , kr other than the positions of erasures. A decoder knows the positions j1, j2, . . . , js, but does not know the positions k1, k2, . . . , kr.

The erasures are indicated by flags, and symbols of the positions of erasures are elements on GF $(2^m)$ as well as symbols of other positions. It is assumed that $2t + s + 1 \leq d$, and $r \leq t$.

First, a syndrome polynomial $$S(x) = \sum_{k=1}^{d-1} S_{k-1} \cdot x^{k-1}$$

is generated from received words $(R_{n-1}, R_{n-2}, \ldots, R_1, R_0)$, where $$S_{k-1} = \sum_{i=1}^{n} R_{n-1} \cdot (\alpha^k)^{n-i}.$$

Subsequently, $Y_i = \alpha^{ji}$ (i=1, 2, . . . , s) is defined for the s positions j1, j2, . . . , js of erasures, and an erasure position polynomial $\lambda(x)$ for obtaining the positions of erasures is generated:

$$\lambda(x) = \prod_{i=1}^{s} (1 - Y_i \cdot x).$$

If the product S'(x) of the erasure-position polynomial and the syndrome polynomial obtained as described above is obtained, an error position polynomial $\rho(x)$ and an error evaluator polynomial $\omega(x)$ satisfying the following expression for the obtained S'(x) and $x^{d-1}$ are uniquely determined except for differences in the constant coefficients. That is:

$$\deg \omega(x) < t+s, \deg \rho(x) \leq t$$

$$C(x) \cdot x^{d-1} + \rho(x) \cdot S'(x) = \omega(x),$$

where C(x) is a polynomial on GF ($2^m$). The above-described $\omega(x)$ and $\rho(x)$ can be obtained in the course of a Euclidean algorithm for obtaining the greatest common divisor (GCD) polynomial of $$A_0 = x^{d-1}, \text{ and } B_0 = S'(x).$$

$x = \alpha^{-n+i}$ (i=1, ..., n) is substituted for the polynomials $\rho(x)$, $\omega(x)$, formal differential $\rho'(x)$ of $\rho(x)$, erasure position polynomial $\lambda(x)$ and its formal differential.

It is possible to estimate that an error $e_{n-i} = \omega(\alpha^{-n+i})/\rho'(\alpha^{-n+i}) \cdot \lambda(\alpha^{-n+i}))$ is generated in the i-th symbol ($R_{n-i}$) of the received word for i which makes the value $\rho(\alpha^{-n+i})$ of the error position polynomial obtained as described above "0".

It is also possible to estimate that an erasure $E_{n-i} = \omega \cdot (\alpha^{-n+i})/(\lambda'(\alpha^{-n+i}) \cdot (\rho^{-n+i}))$ is present at the position of erasure.

Accordingly, an error can be corrected by obtaining $R'_{n-i} = R_{n-i} + p_{n-i}$, where $$p_{n-i} = \begin{cases} e_{n-i}: \rho(\alpha^{-n+i}) = 0 \\ E_{n-i}: \text{in the case of the position of erasure} \\ \text{"0": in other cases.} \end{cases}$$

In the present embodiments, the above-described respective processing is executed with a unifirm load of processing units comprising the same PEs.

First Embodiments

Figure 1:
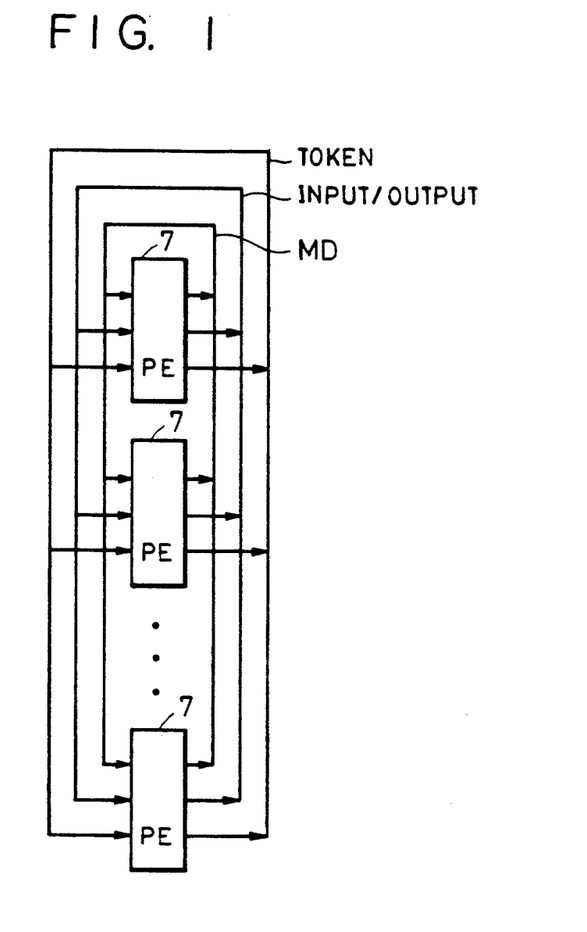
FIG. 1 is a block diagram of the configuration of a first embodiment of the present invention.

FIG. 1 is a block diagram of the configuration of processing in the first embodiment of the present invention wherein respective processing units are independently arranged in parallel.

As described in detail in the above-described IEICE Article, respective processing in the above-described error correction may be reduced to the repetition of a calculation (a.b+c.d), which may be realized using PEs 7 having the configuration shown in FIG. 8.

In the present embodiment, as in the above-described IEICE Article, each processing unit comprises the same PEs, and includes circuitry for outputting a token signal indicating whether the unit is in a busy state or in a waiting state, and a multiple data MD signal indicating a processing mode. These signals are input to other units as shown in FIG. 1.

The MD signal is allocated as the generation of a syndrome polynomial=1, the generation of an erasure position polynomial=2, the multiplication of an erasure position polynomial by a syndrome polynomial=3, the generation of an error position polynomial and an error evaluator polynomial=4, the generation of an error position and an error evaluator=5, and the execution of error correction=6 for each processing.

In the present embodiment, a priority order among units is determined for the execution of the above-described respective processing.

Figure 2:
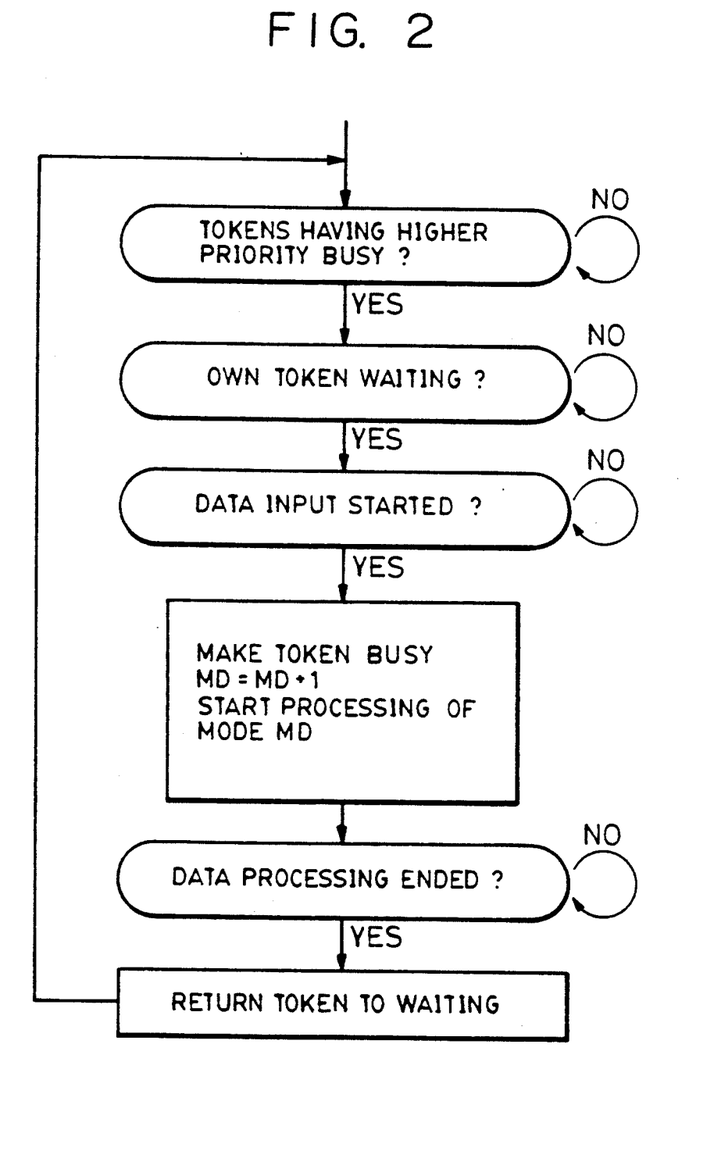
FIG. 2 is a flowchart showing decoding processing for error correction in the first embodiment.

As shown in the flowchart of FIG. 2, which will be described later, if data input to a certain unit is started when units having a higher priority are busy and output busy signals, and a respective unit is in a waiting state, the unit generates the token busy signal, outputs a value incremented by one as the MD, and starts processing of a mode represented by the MD.

According to the above-described configuration, the MD signal is controlled by merely counting its output value, and a processing unit for each token may be simply configured by a ROM (read-only memory) which inputs the values of the tokens of units having a higher priority and outputs the value of the token of a respective unit.

An explanation will now be provided of error correction processing by each processing unit of the first embodiment having the above-described configuration with reference to the flowchart shown in FIG. 2.

At first, all tokens are in a waiting state, and MD=0.

If the input of the above-described received word (code word) starts with the unit having the priority 1, the unit starts processing of MD=1, that is, the generation of a syndrome polynomial S(x), and makes the token busy. At that time, the position of erasure is input to the unit having the priority 2. The unit having the priority 2 thereby outputs a busy signal, and sets MD=2.

The frequency of the calculation of the syndrome polynomial S(x) equals the code length N, and the frequency of the calculation of an erasure position polynomial $\lambda(x)$ equals the number S (N>S) of erasures. Hence, the unit having the priority 2 terminates processing before the unit having the priority 1, and sets the token in a waiting state.

When the input of the first codeword has ended and the second codeword has subsequently been input, the unit having the priority 1 continues to be busy in order to generate the syndrome polynomial of the second codeword. Hence, the output of the syndrome polynomial S(x) of the first codeword is transmitted to the unit having the priority 2 in a waiting state. As a result, the unit having the priority 2 performs the processing of MD=3, that is, the processing of multiplying the syndrome polynomial S(x) by the erasure position polynomial $\lambda(x)$ to obtain the product S'(x).

By subsequently performing the same operation in accordance with the flowchart shown in FIG. 2, processing of all the above-described error correction is efficiently executed.

As explained above, according to the present embodiment, it is possible to prevent an increase in the size of the circuit due to any unevenness in the allocation of processing, and to execute error correction processing more efficiently. Furthermore, by providing a priority order among units, a control unit for controlling the entire system becomes unnecessary. As a result, it is possible to configure an error correction system which may be easily provided as a VLSI (very-large-scale integrated circuit).

Second Embodiment

In the above-described first embodiment, a case may be present wherein the number s of erasures is "0" according to a codeword. In the conventional method having the systolic array configuration, however, the allocation of unnecessary PEs for the generation of an erasure position polynomial cannot be prevented even if the number s of erasures is "0". Hence, a wasteful processing time is inevitably present.

Figure 3:
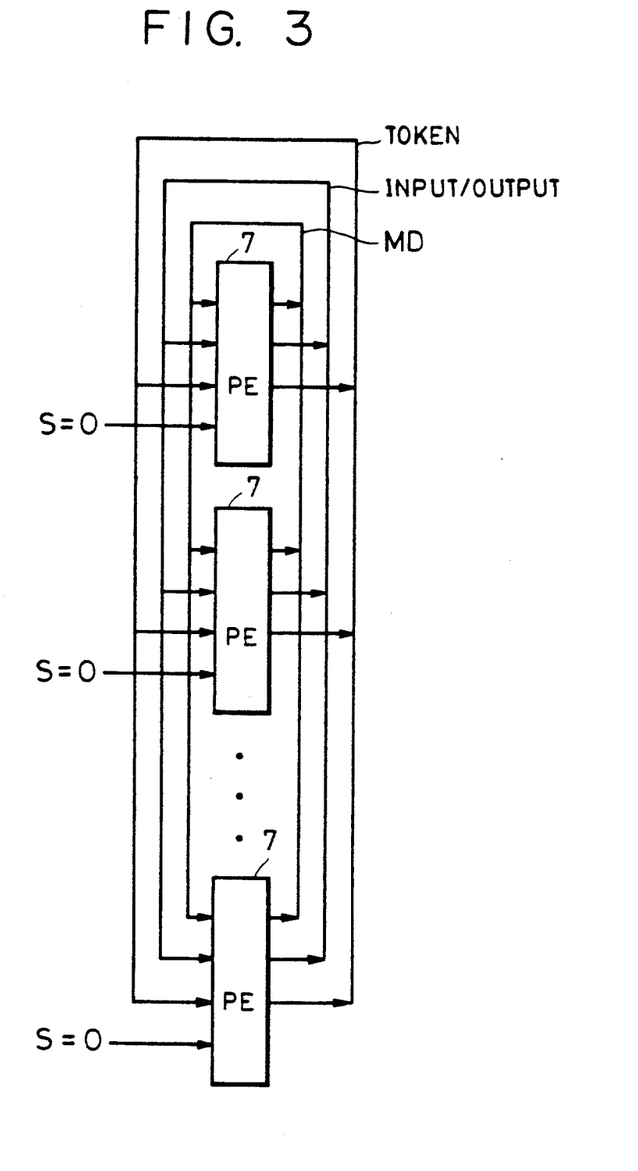
FIG. 3 is a block diagram of the configuration of a second embodiment of the present invention.

In order to solve such a problem, in addition to the configuration shown in FIG. 1, a configuration is adopted wherein it is possible to input a signal indicating the number s of erasures=0. FIG. 3 shows a block diagram of the configuration of processing in a second embodiment of the present invention.

Figure 4:
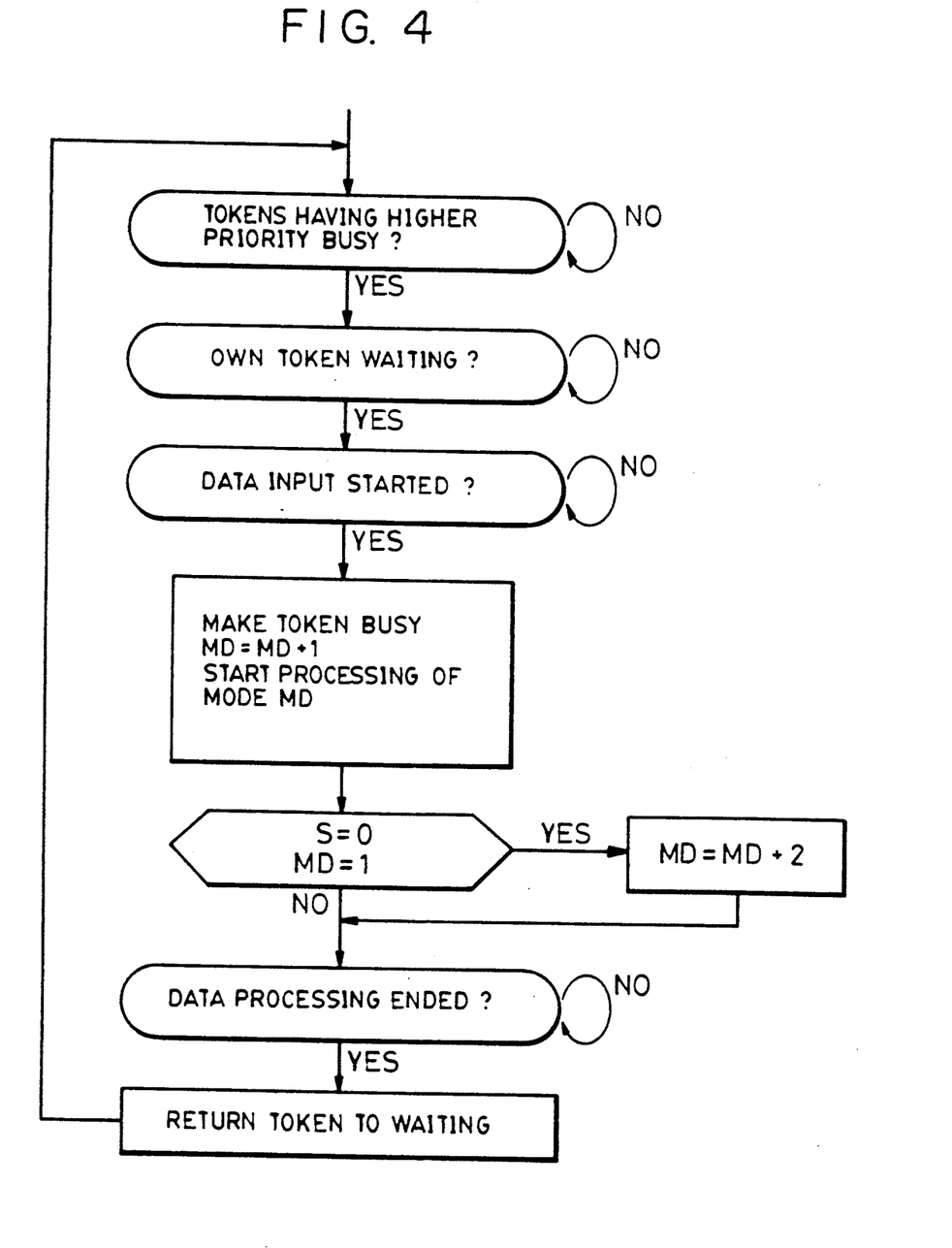
FIG. 4 is a flowchart showing decoding processing for error correction in the second embodiment.

An explanation will now be provided of a correction control when the configuration shown in FIG. 3 is adopted with reference to the flowchart shown in FIG. 4.

The processing in this case is different from the processing shown in FIG. 2 in that the input state of the s=0 signal is determined, and when the s=0 signal is present, the MD is incremented by two, from MD=1, and the corresponding processing is performed.

That is, as in the FIG. 2 processing, all tokens are at first in a waiting state, and MD=0.

If the input of the above-described received word (codeword) to the unit having the priority 1 is started, the unit starts the processing of MD=1, that is, the generation of a syndrome polynomial S(x), and makes the token busy. At that time, if an erasure is present, MD=1 is output, and the process proceeds to the same processing as in the first embodiment. In the present embodiment, however, when a signal indicating the number s of erasures=0 has been input, both the processing of the generation of an erasure position polynomial (MD=2) and the multiplication of the erasure position polynomial by a syndrome polynomial (MD=3) are skipped by outputting MD=3 which is a result of further incrementing the MD by two.

When the input of the first codeword has ended and the second code word has subsequently been input, the unit having the priority 1 continues to be busy. Hence, the output of the syndrome polynomial S(x) of the first codeword is transmitted to the unit having the priority 2. As a result, the unit having the priority 2 starts the processing of MD=4, that is, the generation of an error position polynomial $\rho(x)$ and an error evaluator polynomial $\omega(x)$.

By subsequently performing the same operation in accordance with the flowchart shown in FIG. 4, all the processing of the above-described error correction is efficiently executed.

It is thereby possible to prevent an increase in the size of the circuit due to any unevenness in the allocation of processing, and to execute processing more efficiently. At that time, since processing is automatically selected by inputting a signal indicating whether or not the number of erasures is "0", it is possible to utilize processing units more efficiently.

Third Embodiment

In the foregoing explanation, efficient decoding processing is made possible using a signal indicating that the number s of erasures is "0". However, the present invention is not limited to the above-described decoding processing, but may also be applied to encoding processing.

Figure 5:
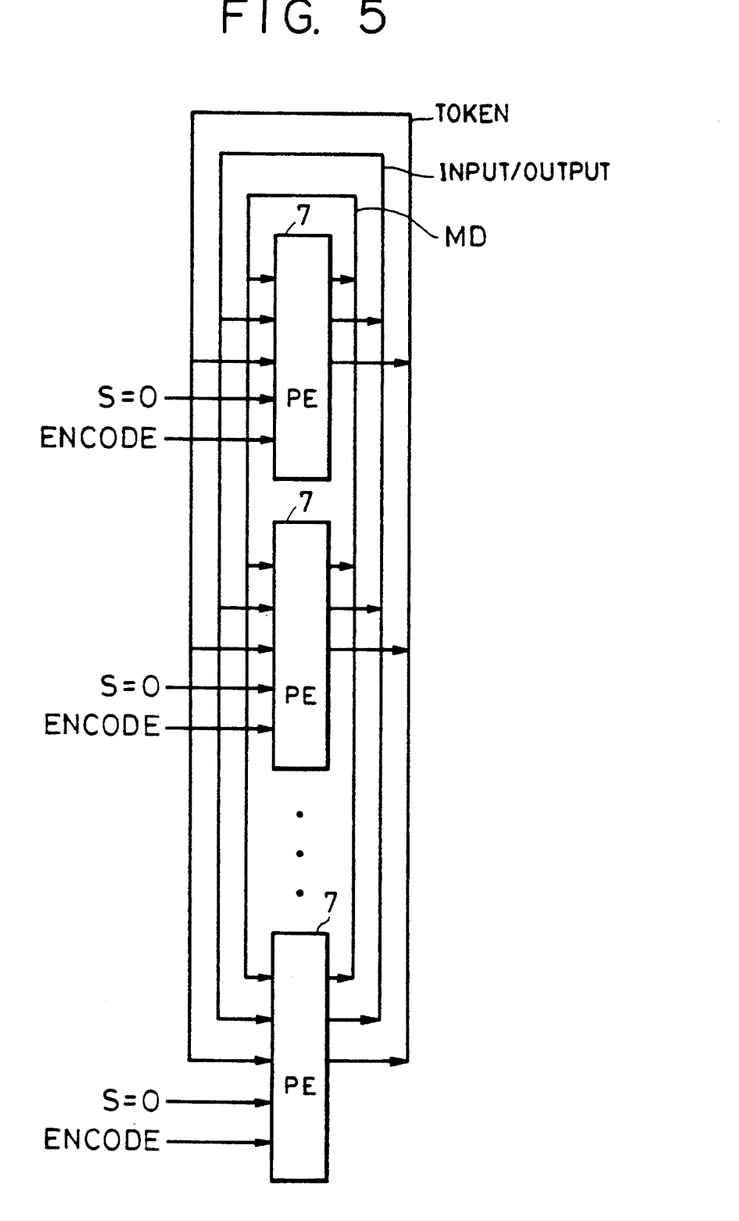
FIG. 5 is a block diagram of the configuration of a third embodiment of the present invention.

In such a case, as shown in FIG. 5, an input terminal for an encode signal for selecting whether each PE is to be used as a decoder or as an encoder is added to each PE in the block diagram of the configuration of the second embodiment shown in FIG. 3, and encoding processing is executed when an encode signal has been output.

Figure 6:
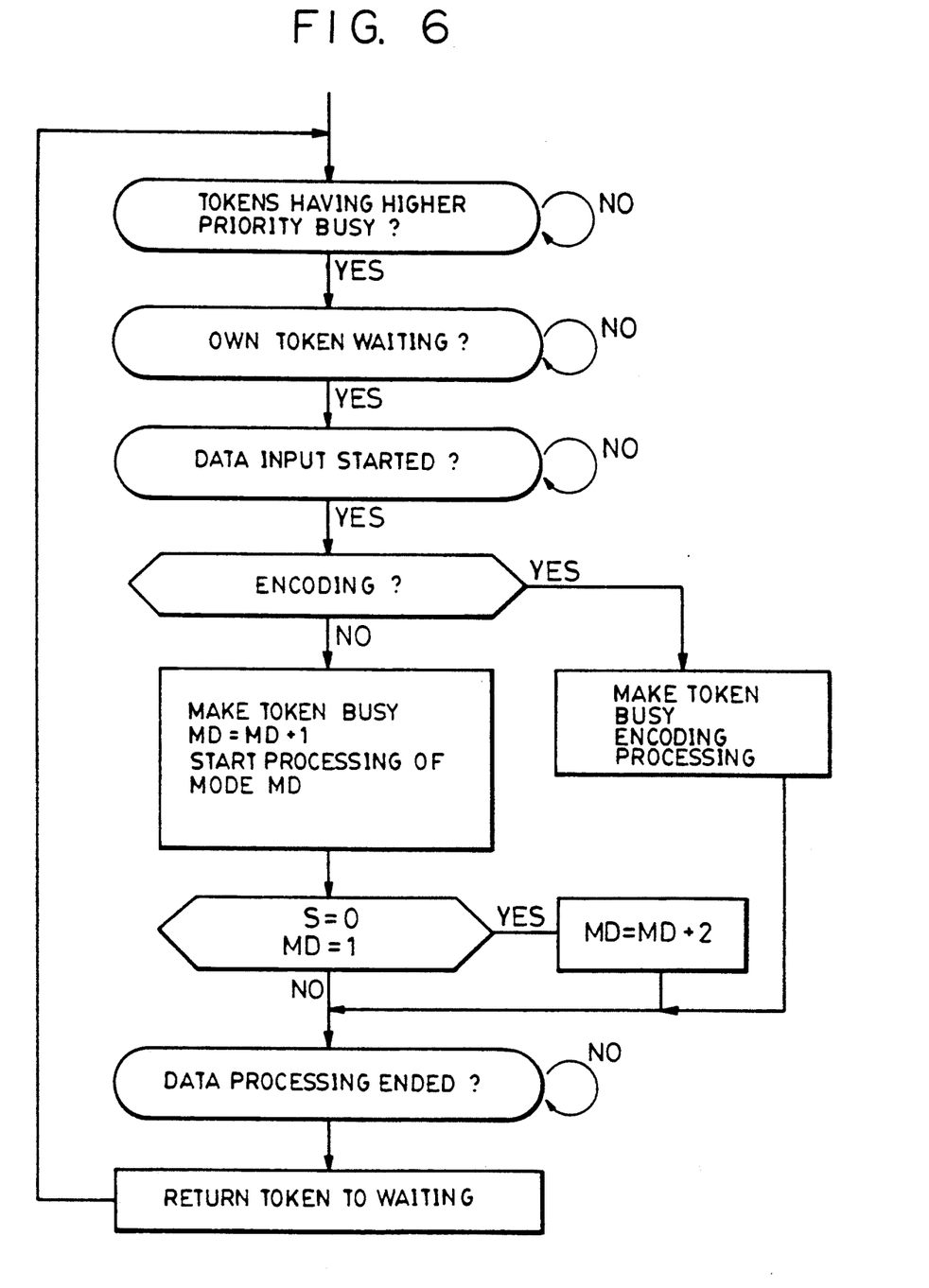
FIG. 6 is a flowchart showing encoding and decoding processing for error correction in the third embodiment.

Encoding processing/decoding processing is performed in accordance with the procedure shown in FIG. 6.

In the present embodiment, encoding processing is made possible in addition to the decoding processing shown in FIG. 4. It is determined whether encoding processing is to be executed or decoding processing is to be executed according to an encode signal. If an encode signal has been output, encoding processing is performed.

In this case, the unit having the highest priority among units whose tokens are in a waiting state executes encoding processing, and generates the above-described P(x).

In this case, however, since encoding processing ends with one processing step as described above, other units are not required to be linked. Hence, the MD is not incremented.

By subsequently performing the same operation in accordance with the flowchart shown in FIG. 6, all the processing of the above-described error correction is efficiently executed.

As explained above, according to the present embodiment, it is possible to prevent an increase in the size of the circuit due to any unevenness in the allocation of processing.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

Furthermore, since processing is automatically selected by inputting a signal (s=0) indicating whether or not the number of erasures is "0" and a signal (encode) indicating encoding, the present embodiment provides the effect that processing units can be utilized more efficiently than in a conventional method, for example, the method shown in the above-noted IEICE Article.

Furthermore, by providing a priority order among units, a control unit for controlling the entire system becomes unnecessary. As a result, it is possible to configure an error correction system which is more suitable for a VLSI.

As described above, according to the present invention, it is possible to prevent an increase in the size of the circuit due to any unevenness in the allocation of processing, and to execute processing more efficiently.

Furthermore, it is possible to utilize processing units more efficiently by automatically selecting processing by inputting a signal indicating whether or not the number of erasures is "0".

Moreover, by providing a priority order among units, a control unit for controlling the entire system becomes unnecessary. As a result, it is possible to configure an error correction system which is more suitable for a VLSI.

What is claimed is:

1. An error correction system comprising:
   a plurality of processing elements capable of parallel operation while being connected to one another, each of which comprises:

detection means for detecting a condition of a respective element and conditions of elements having a higher priority than the respective element;

processing means capable of executing each step in a series of processing steps for error correction;

recognition means for recognizing a processing step to be performed for data serving as an object of processing among said series of processing steps; and control means for controlling said processing means to execute the processing recognized by said recognition means when said detection means detects that all the elements having a higher priority are incapable of performing processing and the respective element is capable of performing processing.

2. An error correction system according to claim 1, wherein said recognition means comprises means for recognizing the processing to be performed at a certain time based on processing performed for the data serving as the object of processing at a preceding time.

3. An error correction system according to claim 1, further comprising notification means for notifying other elements of processing executed by the respective element, and wherein said recognition means comprises means for recognizing the processing to be performed at a certain time, based on the processing notified from an element which has previously performed processing of the data serving as the object of processing.

4. An error correction system according to claim 3, wherein said notification means further comprises means for notifying other elements of numerical value information allocated in order to identify respective processing, and wherein said recognition means further comprises means for recognizing processing corresponding to the numerical value information obtained, by performing a predetermined calculation for the notified numerical value information as the processing to be executed.

5. An error correction system comprising:
a plurality of processing elements capable of parallel operation while being connected to one another, each of which comprises:
detection means for detecting a condition of a respective element and conditions of elements having a higher priority than the respective element;
processing means capable of executing each step in a series of processing steps for error correction;
indication means for indicating whether or not erasure correction is necessary for data serving as an object of processing;
recognition means for recognizing a processing step to be performed for the data serving as the object of processing among said series of processing steps by skipping a processing step for erasure correction among said series of processing steps when said indication means indicates that erasure correction is unnecessary; and
control means for controlling said processing means to execute the processing recognized by said recognition means when said detection means detects that all the elements having a higher priority are incapable of performing processing and the respective element is capable of performing processing.

6. An error correction system according to claim 5, wherein said indication means comprises means for determining whether an erasure of data is present in the data serving as the object of processing.

7. An error correction system comprising:
a plurality of processing elements capable of parallel operation while being connected to one another, each of which comprises:
detection means for detecting a condition of a respective element and conditions of elements having a higher priority than the respective element;
processing means capable of executing encoding of data and each step in a series of processing steps of decoding of the data;
recognition means for recognizing a processing step to be performed for data serving as an object of processing among said series of processing steps; and
control means for controlling said processing means to execute the processing recognized by said recognition means when said detection means detects that all the elements having a higher priority are incapable of performing processing and the respective element is capable of performing processing.

8. An error correction system according to claim 7, wherein said recognition means comprises means for recognizing whether the processing to be executed is one of encoding and decoding, and for recognizing that the is to be performed at a certain time, based on processing performed for the data serving as the object of processing at a preceding time, in a case of decoding.

* * * * *